(12) United States Patent
Ito

(10) Patent No.: US 6,760,691 B1
(45) Date of Patent: Jul. 6, 2004

(54) APPARATUS FOR INDICATING STRENGTH OF BUILDING STRUCTURE, AND RECORDING MEDIUM FOR STRENGTH INDICATION PROGRAM

(75) Inventor: Hiromichi Ito, Minokamo (JP)

(73) Assignee: Kabushiki Kaisha Enu Shi Enu, Gifu-ken (JP)

( * ) Notice: Subject to any disclaimer, the term of this patent is extended or adjusted under 35 U.S.C. 154(b) by 0 days.

(21) Appl. No.: 09/529,579

(22) PCT Filed: Aug. 19, 1999

(86) PCT No.: PCT/JP99/04460
§ 371 (c)(1),
(2), (4) Date: Jun. 22, 2000

(87) PCT Pub. No.: WO00/11580
PCT Pub. Date: Mar. 2, 2000

(30) Foreign Application Priority Data

Aug. 19, 1998 (JP) .......................... 10-250370

(51) Int. Cl.⁷ .............................................. G06F 17/50
(52) U.S. Cl. ..................... 703/1; 703/2; 703/7; 702/42
(58) Field of Search ...................... 703/1, 2, 7; 702/42; 73/789

(56) References Cited

U.S. PATENT DOCUMENTS

| | | | | |
|---|---|---|---|---|
| 5,680,738 A | * | 10/1997 | Allen et al. ................ | 52/729.1 |
| 5,777,236 A | * | 7/1998 | Walls .......................... | 73/786 |
| 5,841,040 A | * | 11/1998 | Walls .......................... | 73/789 |
| 6,014,503 A | * | 1/2000 | Nagata et al. ............... | 703/1 |
| 6,052,652 A | * | 4/2000 | Lee ............................. | 702/42 |
| 6,165,406 A | * | 12/2000 | Jang et al. .................. | 264/308 |

FOREIGN PATENT DOCUMENTS

| | | |
|---|---|---|
| JP | 59163665 A | 9/1984 |
| JP | 59163665 | 9/1984 |
| JP | 02275579 A | 11/1990 |
| JP | 04291466 A | 10/1992 |
| JP | 04326173 A | 11/1992 |
| JP | 06119418 | 4/1994 |
| JP | 07056970 A | 3/1995 |
| JP | 08022479 | 1/1996 |
| JP | 08036591 A | 2/1996 |
| JP | 08123837 A | 5/1996 |
| JP | 08166979 A | 6/1996 |
| JP | 09319773 A | 12/1997 |
| JP | 11085818 | 3/1999 |
| WO | WO 00/11580 | * 3/2000 |

OTHER PUBLICATIONS

"ETABS® Three Dimensional Analysis and Design of Building Systems", Users Manual vols. 1 and 2, Computers and Structures, Inc. Version 7.0, Dec. 1999.*

(List continued on next page.)

Primary Examiner—Kevin J. Teska
Assistant Examiner—Fred Ferris
(74) Attorney, Agent, or Firm—Beyer Weaver & Thomas LLP

(57) ABSTRACT

A strength distribution diagram 33 of selected building structural components, which are selected from a virtual three-dimensional model of building structural components of a building structure created by a CAD program, is constructed on a plane. Stress values of the building structural components arranged in the strength distribution diagram 33 are computed based on stress computational data of the building structural components consistent with attributes of the building structural components. A plurality of strength level display modes is provided for each building structural component, and strength of each building structural component is indicated with a predetermined color based on the computed stress value.

10 Claims, 12 Drawing Sheets

OTHER PUBLICATIONS

"STAAD.Pro RC Designer", Research Engineers Ltd., 1999.*

"Reevaluation of a Nuclear Power Containment Structure", J. Arros, EQE Review, Fall 1995.*

"ETABS Product Description", Computers and Structures Inc., Dec. 1999.*

Technical Notes on Brick Construction, Brick Industry Association, 39B Revised Mar. 1988.*

Dudek et al., "An Efficient Approach to Predict Solder Fatigue Life and Its Application to SM–and Area Array Components", 1997 Electronic Components and Technology Conference.

* cited by examiner

| ADDRESS | nn | nn+1 | nn+2 | nn+3 | nn+4 | nn+5 |
|---|---|---|---|---|---|---|
| COLOR | BLUE | LIGHT BLUE | YELLOW GREEN | YELLOW | PINK | RED |
| STRESS VALUE | 0.00~0.24 | 0.25~0.49 | 0.50~0.74 | 0.75~0.99 | 1.00~1.24 | 1.25~1.50 |

T1

| NUMBER | X5 | SECTION | FRAME |

| X1 | 1000 | X2 | 6500 |

| Y1 | 7000 | Y2 | 7000 |

PRINT THE REPORT ☐

FIG. 3(b)

| | | | |
|---|---|---|---|
| NUMBER | X5 | SECTION | FRAME |

TYPE: THREE LAYER COLUMN

COORDINATE

| | | | |
|---|---|---|---|
| X1 | 1000 | X2 | 6500 |
| Y1 | 7000 | Y2 | 7000 |
| Y1 | 7000 | Y2 | 7000 |
| Y1 | 7000 | Y2 | 7000 |

EW

E120+F330

BUCKING LENGTH  X-DIRECTION  1  TIMES

Y-DIRECTION  1  TIMES

PRINT THE REPORT ☑

FIG. 4(b)

| NUMBER | R5 | SECTION | FLOOR |

ROOM MANE [          ]

DIRECTION OF TRANSMISSION  (●) X   ( ) Y

FIXED LOAD  45  kg/m²

FLOOR LOADING  180

BEAM-COLUMN LOADING  130

SEISMIC LOADING  60

PRESENCE OF SNOW  ☐

FIG. 5(b)

| NUMBER | W1 | SECTION | WALL |

DIRECTION OF
TRANSMISSION

● VERTICAL   ○ HORIZONTAL

FIXED LOAD    100   kg/m$^2$

PRESENCE OF WIND
PRESSURE       ☑    FL   1

FIG. 6(b)

APPARATUS FOR INDICATING STRENGTH OF BUILDING STRUCTURE, AND RECORDING MEDIUM FOR STRENGTH INDICATION PROGRAM

FIELD OF THE INVENTION

This invention relates generally to designing of building structures, and more particularly to strength display devices for displaying strengths of building structural components of a building structure on a display screen thereof, and also to storage media for storing a program for displaying the strengths of the building structural components.

BACKGROUND OF THE INVENTION

For structural designing of the building structures, solid structural plans should be made in consideration of various forces acting on the building structures. For example, various loads, such as fixed load, superimposed load, snow load, wind load, seismic load etc., are applied continuously or temporarily on the building structures. Furthermore, various stresses, such as compressive stress, shearing stress, bending stress, tensile stress, etc., are created within the building structures in response to such applied loads.

In the structural designing of the building structures, configurations of the building structures, frame patterns, and positions and sizes of the building structural components are determined in compliance with safety standards regarding the various stresses induced by the described loads. That is, in the process of determining the positions and sizes of the building structural components in the structural designing of the building structures, it should be determined whether the building structural components have required strengths by computing the stresses of the building structural components that will be induced by the loads when these building structural components are actually placed at designated positions.

However, the results of the strength computation for the building structural components are obtained merely as computed values in the prior art. Therefore, although a level of safety that is satisfied by each structural component can be seen as numeric data, there is no visualized information showing a relationship between the actual structural component and its level of safety, and therefore, it is difficult to understand what level of safety is satisfied with the structural component arranged at a certain position within the building structure. Furthermore, it is difficult to see a level of safety of entire building structure by the displayed various numeric data. Furthermore, a value of each stress applied to each structural component can be changed based on load conditions. However, such changes in the values of the stresses are not easily understood with the displayed numeric data.

The present invention addresses these disadvantages. An objective of the present invention is to indicate strengths of the building structural components, which are determined based on the loads and the stresses acting on the building structural components, on displayed images of the building structural components on a display screen of a strength display device in an easily understandable manner.

SUMMARY OF THE INVENTION

To achieve the objective of the present invention, a strength display device for displaying strength of a building structure defined in claim 1 of the present invention includes a storage means for storing shape data and relative position data of building structural components of the building structure; a two-dimensional diagram constructing means for constructing a two-dimensional diagram, wherein the two-dimensional diagram constructing means first constructs a virtual three-dimensional model of assembled building structural components based on the shape data and the relative position data retrieved from the storage means and then constructs the two-dimensional diagram by projecting selected building structural components, which are selected from the building structural components of the virtual three-dimensional model, onto a plane; a display means for displaying the two-dimensional diagram constructed by the two-dimensional diagram constructing means on a display screen; a stress computing means for computing stress values of the building structural components based on stress computational data of the building structural components consistent with attributes of the building structural components; a selecting means for selecting a predetermined strength level display mode from a plurality of strength level display modes for the respective building structural components based on the stress values of the building structural components computed by the stress computing means, wherein the plurality of strength level display modes are provided for each of the building structural components arranged in the two-dimensional diagram; and a strength display means for displaying the predetermined strength level display modes of the building structural components selected by the selecting means on the display screen as the strength level display modes of the building structural components arranged in the two-dimensional diagram. With this arrangement, the virtual three-dimensional model of assembled building structural components is constructed based on the shape data and the relative position data of the building structural components retrieved from the storage means. Examples of the storage means for storing these shape data and the relative position data include memory elements such as semiconductor memories, magnetic discs and external storage devices such as flexible disks, CD-ROM disks, magneto-optical disks, and so on. The two-dimensional diagram, which is obtained by projecting the selected building structural components of the virtual three dimensional model onto the plane, is displayed on the display screen.

Each building structural component has different attributes depending on a type (e.g., columns or beams) of the building structural component, a shape of the building structural component, a position of the building structural component and so on. Therefore, the stress computational data of the building structural component vary from one to another. The stress computational data can be preinstalled in the storage device or can be newly inputted. Examples of the stress computational data include the shape data, load data, material data and so on. The stress values of the building structural components are computed by the stress computing means based on the stress computational data. Then, the strength display means selects a predetermined strength level display mode from a plurality of strength level display modes for the respective building structural components of the two-dimensional diagram displayed on the display screen based on the stress values of the building structural components.

Various colors can be use as the strength level display modes. For example, if the stress value of the building structural component is relatively small (i.e., the building structural component has relatively high safety level), any cold color such as blue giving safe impression can be used to indicate the building structural component. If the stress value of the building structural component is relatively high (i.e., the building structural component has relatively low safety level), any warm color such as red giving dangerous impression can be used to indicate the building structural component. Other than the various colors, any display modes such as various types of lines or various types of shades can be used as the strength level display modes.

Furthermore, as defined in claim 3, the present invention provides a storage medium that stores a program for displaying strength of a building structure on a display screen through a computer, wherein the program constructs a virtual three-dimensional model of assembled building structural components of the building structure based on shape data and relative position data of the building structural components and displays a two-dimensional diagram on the display screen, wherein the two-dimensional diagram is obtained by projecting selected building structural components, which are selected from the building structural components of the virtual three-dimensional model, onto a virtual projecting plane located at a predetermined distant position in a predetermined direction, wherein the program further computes stress values of the building structural components based on stress computational data of the building structural components consistent with attributes of the building structural components, and then selects a predetermined strength level display mode from a plurality of strength level display modes for the respective building structural components based on the stress values of the building structural components, wherein the plurality of strength level display modes are provided for each of the building structural components arranged in the two-dimensional diagram, and wherein the program then displays the predetermined strength level display modes on the display screen as the strength level display modes of the building structural components arranged in the two-dimensional diagram.

With this arrangement, if the program is executed in the computer, advantages similar to that of the device defined in claim 1 will be provided.

BRIEF DESCRIPTION OF THE DRAWINGS

FIG. 3(*b*) is a table showing attributes of one component displayed in the basic frame diagram.

FIG. 4(*b*) is a table showing attributes of one component displayed in the first skeletal structural diagram.

FIG. 5(*b*) is a table showing attributes of one component displayed in the second skeletal structural diagram.

FIG. 6(*b*) is a table showing attributes of one component displayed in the third skeletal structural diagram.

DETAILED DESCRIPTION OF THE PREFERRED EMBODIMENTS

A strength display device for displaying strength of a building structure in accordance with one embodiment of the present invention will now be described with reference to FIGS. 1 to 10.

Figures 1, 2:
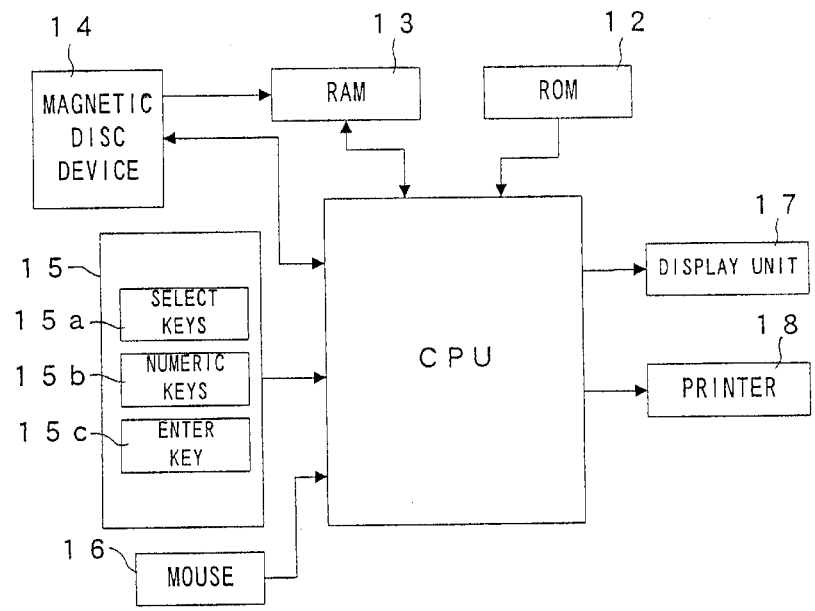
FIG. 1 is a block diagram showing an electrical structure according to an embodiment of the present invention.
FIG. 2 is a table showing stress values and their corresponding display colors according to the same embodiment of the present invention.

As shown in FIG. 1, the strength display device includes a CPU (Central Processing Unit) 11 that is interconnected with a ROM (Read Only Memory) 12, a RAM (Random Access Memory) 13, a magnetic disk device 14, an input device 15, a mouse 16, a display unit 17 and a printer 18. A program for controlling operations of the entire strength display device, a stress computing program for computing stress values of building structural components of the building structure based on load data of the building structural components, and various data required for running such programs are stored in the ROM 12. The RAM 13 is a rewritable memory for temporarily storing various information required for operations of the CPU 11. Shape data, relative position data and load data of the building structural components are stored in the magnetic disk device 14, and the CPU 11 transfers these data to the RAM 13 in response to operations of the strength display device.

Various instructions and data are given to the CPU 11 through the input device 15. The input device 15 includes select keys 15*a*, numeric keys 15*b* and an enter key 15*c*. The select keys 15*a* are used to select a desired two-dimensional diagram or a desired process. The numeric keys 15*b* are used to enter new data. The enter key 15*c* is used to execute a selected process and define data contents. The mouse 16 is an auxiliary device of the input device 15 and can provide functions similar to that of the select keys 15*a* and the enter key 15*c* by moving a mouse cursor to a directive box displayed on a display screen of the display unit 17 and then pressing a button switch. Furthermore, any building structural component can be selected by moving the mouse cursor to the building structural component displayed in a two-dimensional diagram of the building structure and then pressing the button switch. The display unit 17 can display the two-dimensional diagram on its display screen based on the shape data and the relative position data of the building structural component retrieved from the RAM 13 and can also display a table showing attributes of the building structural component. The printer 18 can print the two-dimensional diagram and the table displayed on the display screen of the display unit 17.

The CPU 11 can invoke the stress computing program stored in the ROM 12 and can compute the stress values of the building structural components based on the shape data, the relative position data and the load data of the building structural components. Furthermore, the CPU 11 can invoke a color determining program stored in the ROM 12 and can determine colors of the building structural components to be displayed on the display screen of the display unit 17 based on the computed stress values (i.e., based on strengths) of the building structural components. As shown in FIG. 2, the ROM 12 stores a table T1 that indicates six stress value ranges and corresponding six colors showing six strength levels at its addresses from nn to nn+5. Under the control of the color determining program, the CPU 11 retrieves an appropriate color of each building structural component corresponding with the stress value range to which the computed stress value of the building structural component belongs. For example, if a stress value of one building structural component under predetermined conditions is assumed to be 0.11, blue is selected as a display color showing strength of the building structural component. Settings of the stress value ranges can be changed as desired.

The CPU 11 processes the data based on the control program retrieved from the ROM 12. This data processing will now be described with reference to FIGS. 3 to 10.

The CPU 11 transfers the shape data, the relative position data, and the load data of each building structural component from the magnetic disk device 14 to the RAM 13 in accordance with the control program retrieved from the ROM 12. The CPU 11 then constructs a virtual three-dimensional model of the building structure based on the shape data and the relative position data. In this embodiment, an exemplary plan cross sectional view, which is obtained by horizontally cutting the virtual three-dimensional model of the building structure, is displayed on the display screen of the display unit 17 as the two-dimensional diagram.

Figure 3A:
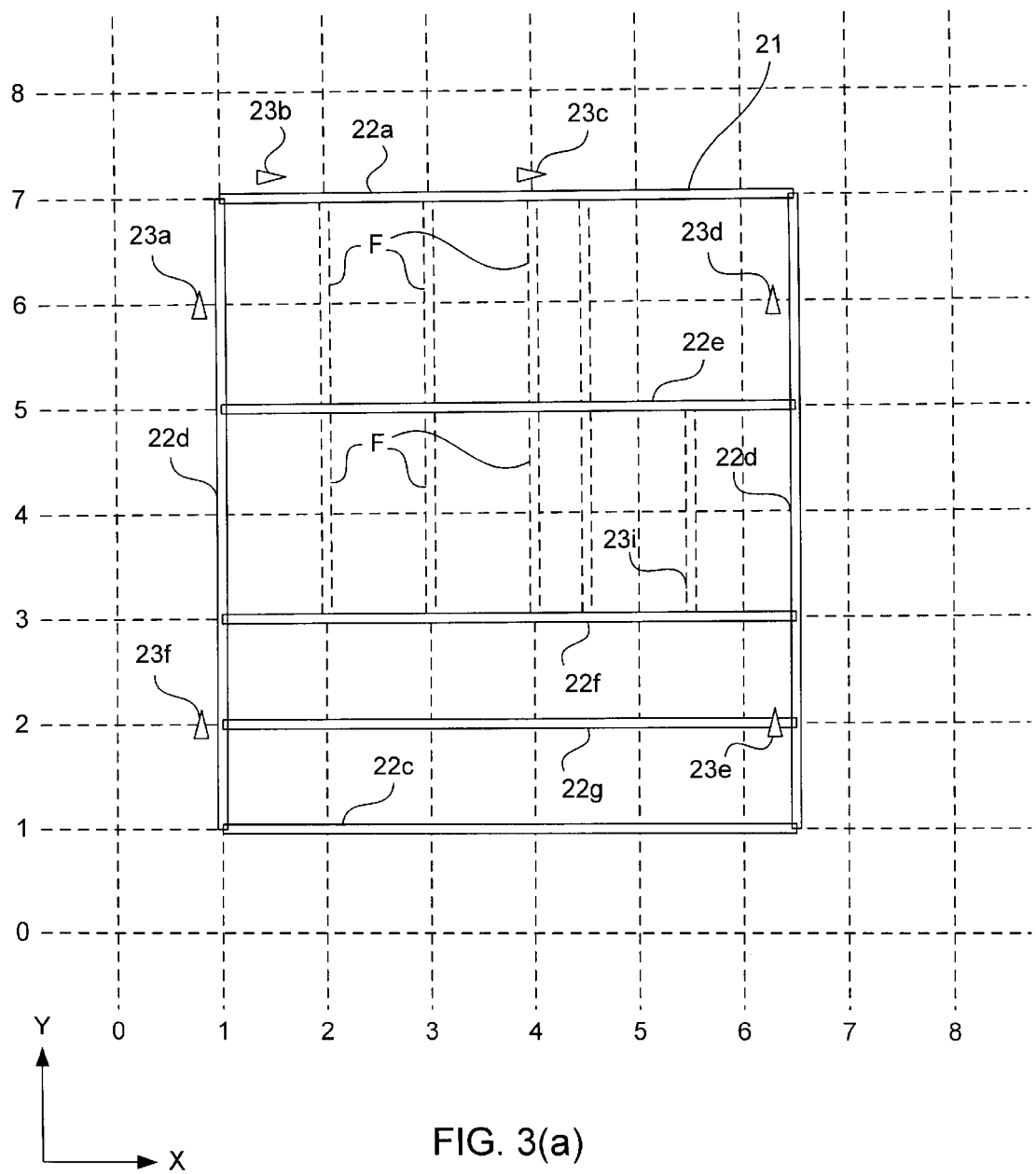
FIG. 3(*a*) is a descriptive view of a basic frame diagram displayed on a display screen.

In the first step, as shown in FIG. 3(a), a basic frame diagram 21 is displayed on the display screen of the display unit 17 by operating the input device 15 or the mouse 16. Frames 22a–22g shown with solid lines act as base locations, at which columns and beams that are subjects of the strength computation are placed. Isosceles triangles 23a–23f indicate other base locations, at which braces are placed. Small frames F shown with dotted lines act as further base locations, at which small columns and small beams are arranged as building structural components that are not subjects of the strength computation. As shown in FIG. 3(b), attributes of each frame arranged in the basic frame diagram 21 can be displayed by operating the input device 15 or the mouse 16. In this embodiment, as an example, the frame 22a (X5) is shown to extend from a coordinate 1000 to a coordinate 6500 in a X-direction and from a coordinate 7000 to the same coordinate 7000 in a Y-direction. In this embodiment, these coordinate data are preinstalled invariable data, and therefore are not rewritable on the strength display device.

Figure 4A:
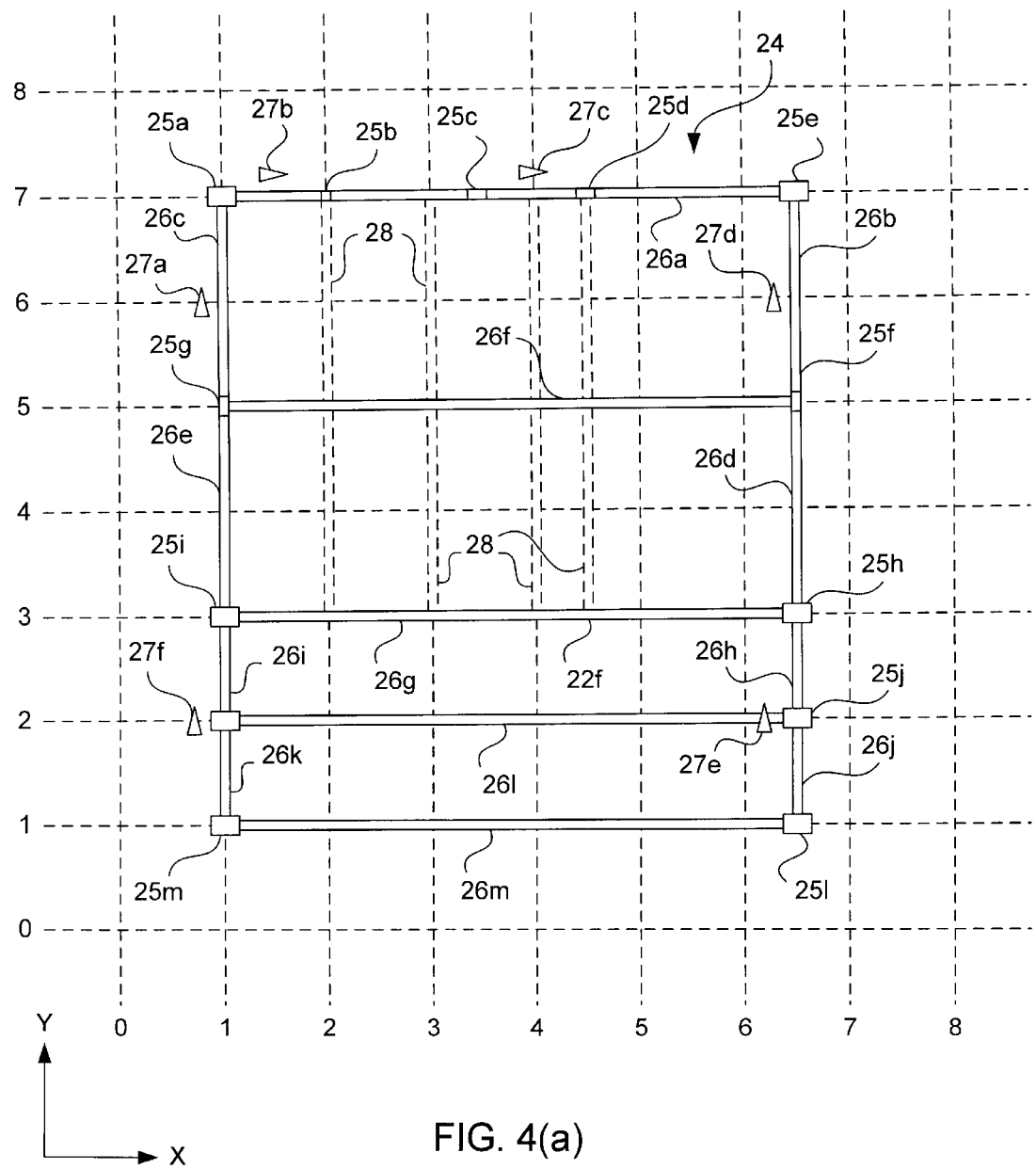
FIG. 4(*a*) is a descriptive view of a first skeletal structural diagram displayed on the display screen.

In the next step, as shown in FIG. 4(a), a first skeletal structural diagram 24 for examining the columns, the beams and the braces is displayed on the display screen of the display unit 17 by operating the input device 15 or the mouse 16. The first skeletal structural diagram 24 shows the columns 25a–25m, the beams 26a–26m, and the braces 27a–27f, all of which are arranged on the frames 22a–22g acting as the base locations and are subjects of the strength computation. The first skeletal structural diagram 24 further shows small beams 28, which are arranged on the frames 23 and are not subjects of the strength computation.

As shown in FIG. 4(b), the attributes of each building structural component arranged in the first skeletal structural diagram 24 can be displayed by operating the input device 15 or the mouse 16. In this embodiment, as an example, the column 25a (C10) is shown to extend from a coordinate 1000 to a coordinate 6500 in a X-direction, from a coordinate 7000 to the same coordinate 7000 in a Y-direction and from a coordinate 610 to a coordinate 3570 in a Z-direction (this Z-direction can not be seen in the two-dimensional diagram of the present embodiment). Furthermore, other data such as the component dimensions, the wood species and the buckling length of each building structural component are also displayed as the attributes. These data are preinstalled invariable data, and therefore are not rewritable on the strength display device in this embodiment.

Figure 5A:
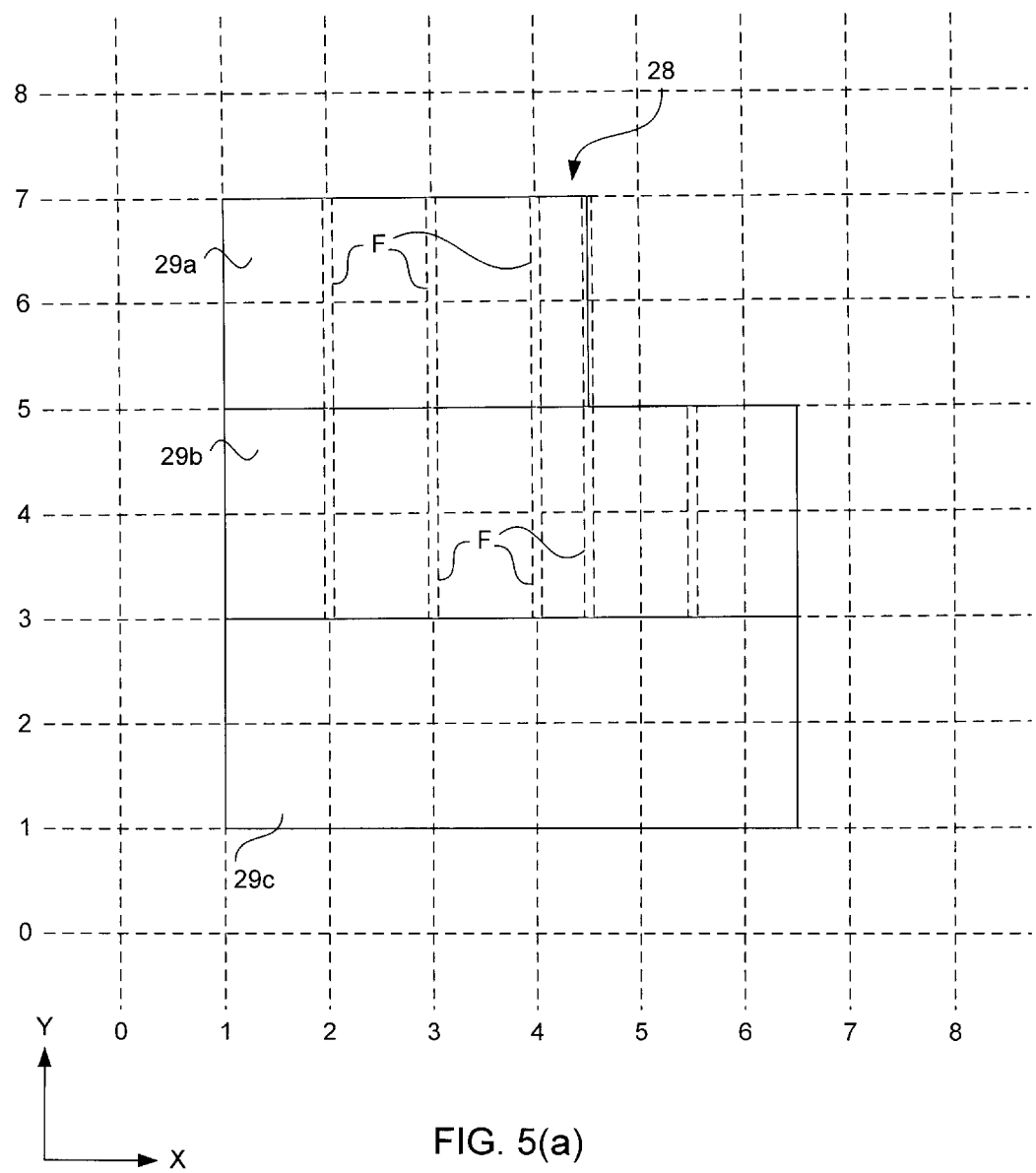
FIG. 5(*a*) is a descriptive view of a second skeletal structural diagram displayed on the display screen.

In the following step, as shown in FIG. 5(a), a second skeletal structural diagram 28 for examining a floor is displayed on the display screen of the display unit 17 by operating the input device 15 or the mouse 16. The second skeletal-structural diagram 28 shows floor sections 29a–29c of a predetermined area, which are divided along the frames 21a–21g acting as the base locations and also along small frames F.

As shown in FIG. 5(b), the attributes of each floor section 29a–29c arranged in the second skeletal structural diagram 28 can be displayed by operating the input device 15 or the mouse 16. In this embodiment, as an example, various load data of the floor section 29a (R5) under different load conditions are shown. In this embodiment, since these load data of each floor section 29a–29c do not have any significant influences on modifications of the fundamental skeletal structure, these load data are handled as variable data that are rewritable on the strength display device (on the display screen).

Figure 6A:
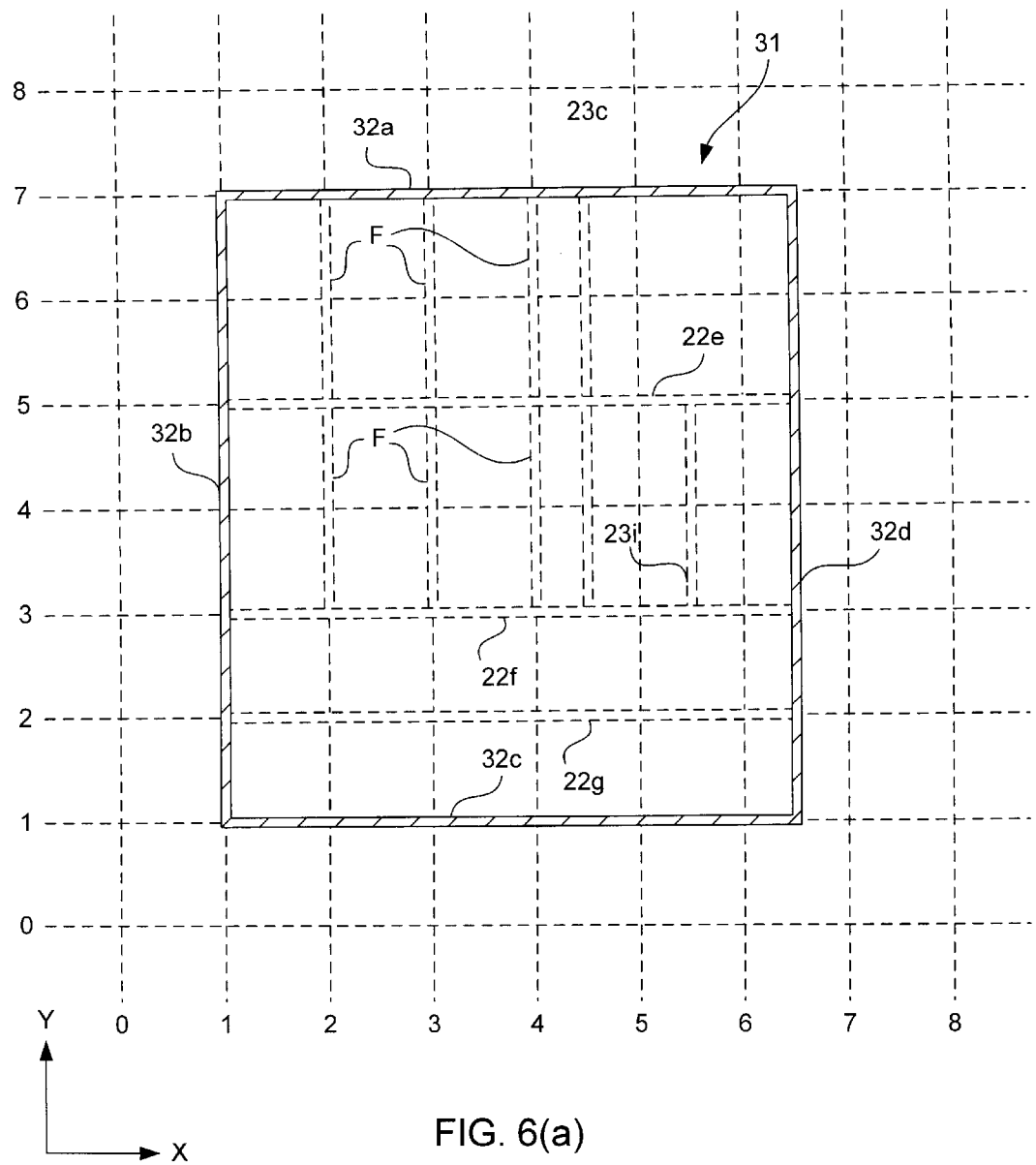
FIG. 6(*a*) is a descriptive view of a third skeletal structural diagram displayed on the display screen.

In the next step, as shown in FIG. 6(a), a third skeletal structural diagram 31 for examining walls is displayed on the display screen of the display unit 17 by operating the input device 15 or the mouse 16. The third skeletal structural diagram 31 shows walls 32a–32d in a predetermined area that are divided along the frames 22a–22g and 23, which act as the base locations as described before.

As shown in FIG. 6(b), the attributes of each wall 32a–32d arranged in the third skeletal structural diagram 31 can be displayed by operating the input device 15 or the mouse 16. In this embodiment, as an example, the load data of the wall 32a (W1) is shown. In this embodiment, since these load data of the walls 32a–32d do not have any significant influences on modifications of the fundamental skeletal structure, these load data are handled as variable data that are rewritable on the strength display device (on the display screen).

As described above, the attributes of each indispensable building structural component of the building structure are examined, and desired load data of the floor sections and the walls can be inputted. Alternatively, the original settings of these load data can be used without changing these data.

Figure 7:
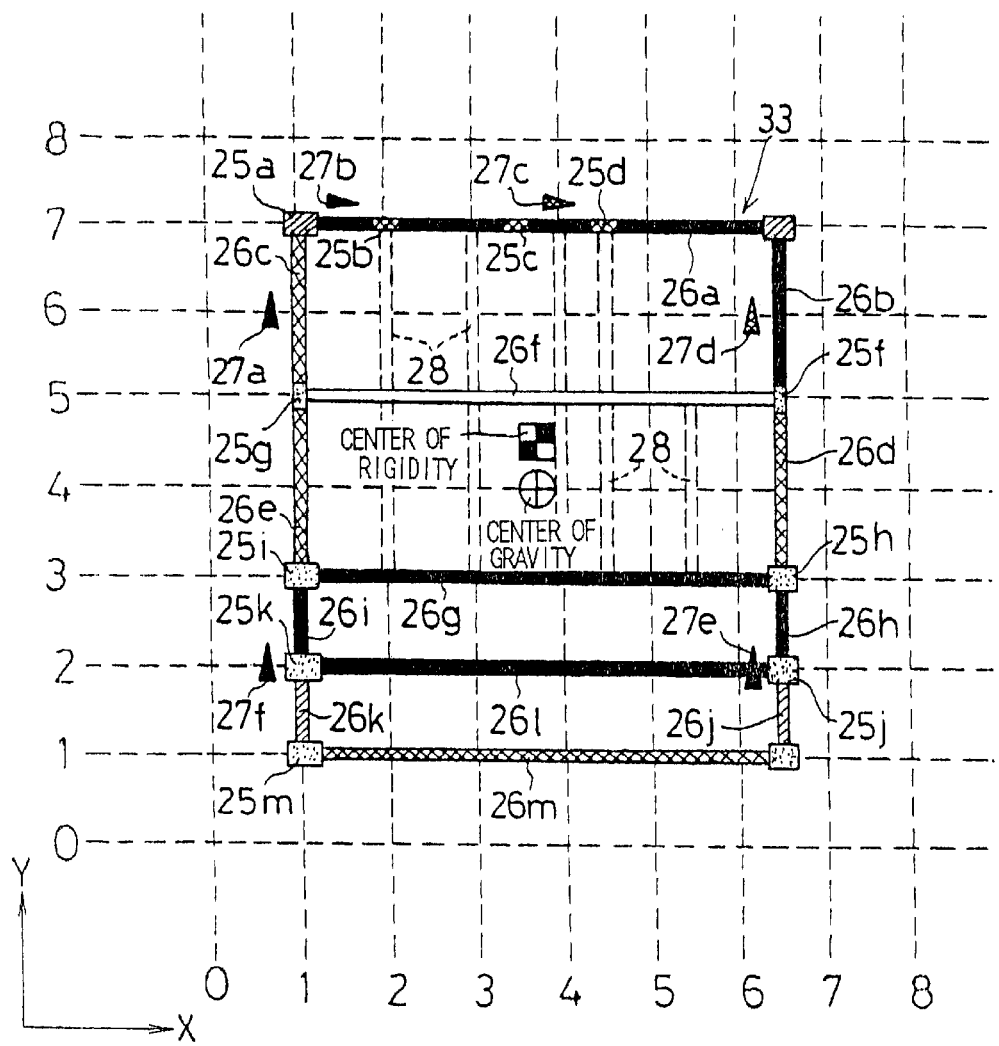
FIG. 7 is a descriptive view of a strength distribution diagram displayed on the display screen.

Then, the strength computation is conducted by operating the input device 15 or the mouse 16. That is, the stress values of the columns, the beams and the braces, which are subjects of the strength computation, are computed, and then a strength distribution diagram 33 is displayed on the display screen of the display unit 17, as shown in FIG. 7. In the strength distribution diagram 33, the columns, the beams and the braces are displayed with corresponding colors that are determined based on the computed stress values of these components.

Figure 8:
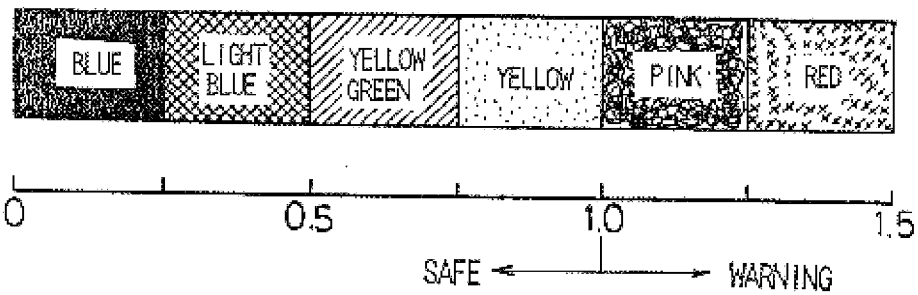
FIG. 8 is a table showing relationships between the strengths and corresponding colors thereof.
Figure 9:
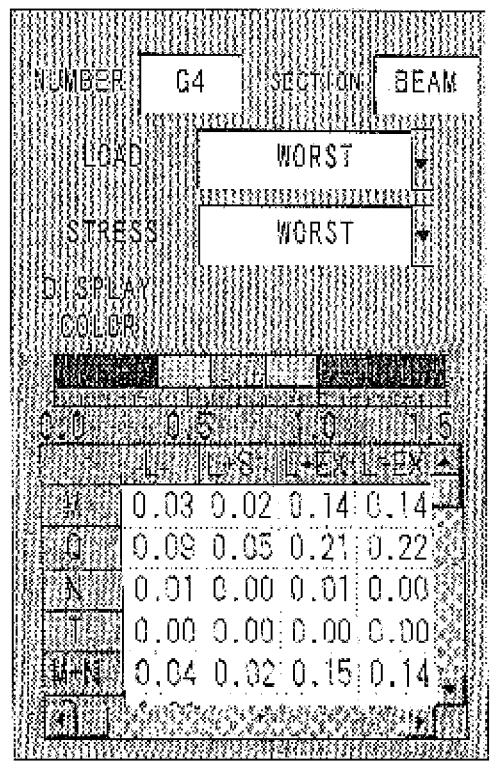
FIG. 9 is a table showing attributes of one building structural component that is arranged in the strength distribution diagram displayed on the display screen.

As shown in FIGS. 8 and 9, the color of each component may vary depending on the computed stress value of the component, and therefore the strength of the component is indicated with the respective color. In this embodiment, six colors can be used depending on the stress value of the component, as shown in FIG. 8. Among these colors, blue indicates the greatest strength (the smallest stress value), and red indicates the smallest strength (the largest stress value). The strengths are decreased in the order blue>light blue>yellow green>yellow>pink>red. The relationships between the colors and the stress values can be changed as desired. For example, although blue is initially set for a stress value range of 0–0.24, this stress value range for blue can be changed to 0–0.49. This change can be conducted on a table shown in FIG. 9 by operating the mouse 16.

Stress types computed herein include bending stress (M), sharing stress (Q), compressive stress (N), tensile stress (T), bending stress+compressive stress (M+N) and strain ( ) of each building structural component, and bending stress (jM), shearing stress (jQ), compressive stress (jN), tensile stress (jT) and bending stress+compressive stress (jM+N) of a joint of each building structural component.

The load data for computing the stress values include fixed load (own weight of the component+total weight of three standard adults (180 kg): L), fixed load+snow load (L+S), fixed load+X-direction seismic force (L+±EX), fixed load+Y-direction seismic force (L+±EY), fixed load+X-direction wind pressure (L+±WX), fixed load+Y-direction wind pressure (L+±WY) and fire load (fire). Stress values (a total of 121 values) are derived from combinations of all of the described stresses and all of the described loads for each building structural component that is a subject of the strength computation.

As shown in FIG. 9, the attributes of each building structural component arranged in the strength distribution diagram 33 can be displayed on the display screen by operating the input device 15 or the mouse 16. In this embodiment, as an example, computed stress values for the various load data of the beam 26a (G4) are shown in FIG. 9. Furthermore, in the strength distribution diagram 33, the worst load data (indicated as "worst" in FIG. 9) and the worst stress value (also indicated as "worst" in FIG. 9) of each building structural component are used as parameters for determining the colors of the building structural components in the default setting. That is, if one computed stress value of any building structural component is larger than the rest of the computed stress values of the same building structural component, this component is displayed with the color that corresponds with this larger computed stress value even if the other computed stress values are smaller than this larger stress value. Besides the "worst" one, the parameter can be changed to any one, such as the fixed load+the snow load (L+S).

The strength distribution diagram 33 is then printed out through the printer 18.

Figure 10:
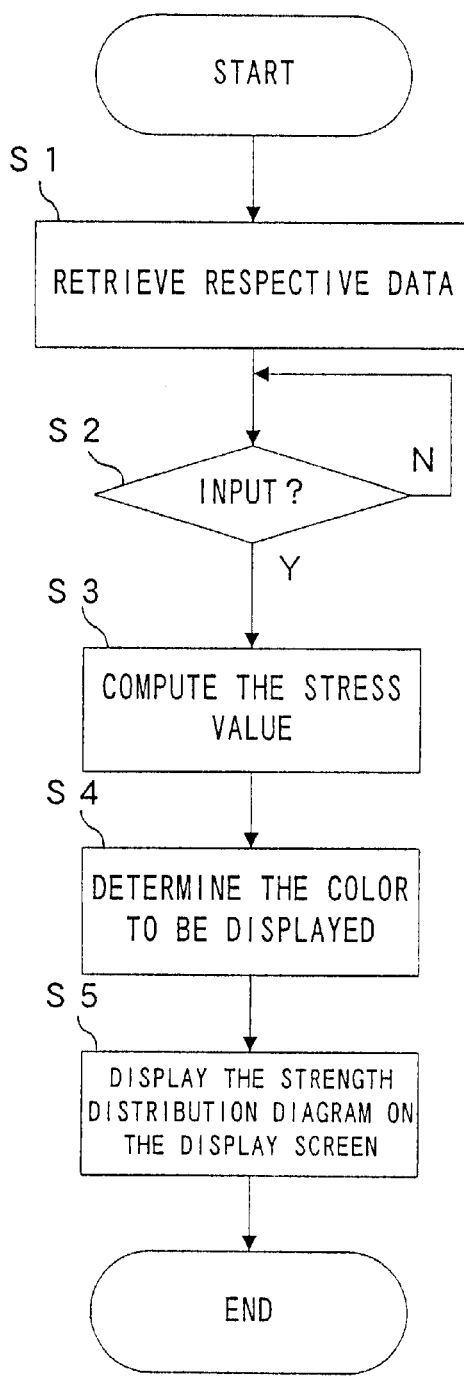
FIG. 10 is a flow chart showing a process of constructing the strength distribution diagram in the same embodiment.

Operations of the strength display device in accordance with the present embodiment will now be described with reference to a flow diagram shown in FIG. 10.

In step S1, the CPU 11 retrieves the shape data, the relative position data and the load data of the building structural components stored in the RAM 13 and also retrieves the load data of the floors and/or the walls if the load data of the floors and/or the walls are modified previously. In step S2, at predetermined timing, the CPU 11 determines whether there is any input that causes execution of the stress computing program. When it is determined that there is the input that causes execution of the stress computing program, the flow proceeds to step S3. In step S3, the stress values of the building structural components are computed through the stress computing program (only for the columns, the beams and the braces that are subjects of the strength computation). In the following step S4, the color of each building structural component is determined in accordance with the computed stress values, which are computed based on the predetermined load conditions and the stress types. In step S5, the strength distribution diagram 33 is then displayed on the display screen of the display unit 17.

The described embodiment provides the following advantages.

Since the columns, the beams and the braces serving as the building structural components are colored with the colors indicating the strengths corresponding with the computed stress values of these building structural components, and are displayed on the two-dimensional strength distribution diagram 33, the strengths of these building structural components are visually directly appealed to a viewer with the colors unlike the prior art where only stress values are displayed as numerals, so that the strengths of the building structural components can be more easily recognized with the present invention. Furthermore, since the differences in the strengths of the building structural components can be seen as the differences in the colors of the building structural components, the differences in the strengths of the building structural components can be more easily recognized in comparison to the prior art.

After all necessary data are determined for a particular building structure, these data are often modified for purpose of strength correction. In such case, since the position and the strength of each building structural component are displayed on the strength distribution diagram 33 along with the corresponding color, the strengths of the entire building structure can be instantaneously recognized from the strength distribution diagram 33, and therefore the strengths of the building structure can be easily corrected to an appropriate strength level.

Alternatively, for example, the stress values can be displayed as numerals on the display screen, and each displayed numeral or a predetermined area surrounding the numeral can be colored based on the strengths. That is, the stress values can be displayed with the colors corresponding with the strengths while there is no visualized relationships between the stress values and the corresponding actual building structural components.

However, in the described embodiment, the building structural components of the building structure, which are positioned at their corresponding positions, are colored in the two dimensional diagram, the strength of each building structural component can be easily and instantaneously understood since there is a closer relationship between each computed numeral (stress value) and the corresponding actual building structural component unlike the above alternative proposal wherein only the corresponding numeral (stress value) is colored.

Since the load data of the floors and the walls can be changed on the display screen, minor modifications, such as changing a tatami-mat floor to a board floor, are possible without changing the fundamental skeletal structure.

Various load data and corresponding stress values can be selected as parameters for determining the colors of the building structural components. Therefore, various stresses under various load conditions can be displayed with the colors by changing the parameters. For example, the bending stress value or the shearing stress value of any building structural component under the presence of the fixed load only can be displayed with the color.

Before obtaining the strength distribution diagram 33, the basic frame diagram 21 and the first to third skeletal structural diagrams 24, 31, 33 can be displayed for confirming conditions before conducting the computation.

The described embodiment can be modified as follows.

In the described embodiment, the various data are transferred from the magnetic disk device 14 to the RAM 13. Alternatively, these data can be transferred from other external storage device such as a flexible disk, a CD-ROM disk, a magneto-optical disk or the like, to the RAM 13. Furthermore, the data can be transferred through a data communication network such as a LAN (Local Area Network), WAN (Wide Area Network) or the Internet.

In the described embodiment, among the data transferred to the RAM 13, the data having significant influences on the building skeletal structure, such as the data of the columns, the beams and the braces, are non-rewritable while the data having insignificant influences on the building skeletal structure, such as the data of the floors and the walls, are rewritable. That is, only some data are rewritable on the strength display device. Alternatively, all data can be made rewritable or non-rewritable.

In the described embodiment, although the various data are preformed and stored in the magnetic disk device 14, these data can be alternatively inputted from the strength display device and can be stored in the RAM 13. Alternatively, only the load data may be inputted from the strength display device.

In the described embodiment, although load conditions of the veranda, the windows and the roof are not considered, these load conditions can be taken into consideration. Furthermore, it is possible to allow selection of special load conditions, such as arrangement of a piano on the floor or construction of the building structure as a shop. The present invention can be applied not only to wooden building structures constructed by the conventional constructing method or the two-by-four constructing method but also to other building structures, such as reinforced concrete building structures. Since the building structures are very variable, the present embodiment merely represents one feasible example.

Although the two-dimensional diagrams are shown as the plan cross sectional views in the described embodiment, the two-dimensional diagrams are not limited to the plan cross sectional views. For example, the two-dimensional diagrams can be longitudinal cross sectional views, perspective views or the like. Furthermore, a plurality of two-dimensional diagrams can be provided for one building structure. For example, in a case of three floor building structures, two-dimensional diagrams of first, second and third floors can be separately provided.

The strengths of the building structural components can be displayed with other sets of colors that are different from the described set of colors, and the number of colors contained in each set of colors can be changed as desired. Furthermore, the strength levels of the building structural components can be displayed with various line types or with various shades ranging from black to white. Furthermore, any marks corresponding with the strengths of the building structural components can be superimposed on the displayed building structural components.

The described types of loads and stresses in the described embodiment are merely examples. In this embodiment, these loads and stresses are obtained as the most universal strength determining conditions, and the types of loads and/or stresses can be increased or decreased.

The printout is not mandatory. Therefore, the printer is not essential element of the present invention. In a case of storing the data, any storage means can be used. Examples of the storage means include magnetic disk devices, RAMs, flexible disks, CD-ROM disks, magneto-optical disks and so on. Accordingly, the present embodiments are to be considered as illustrative and not restrictive, and the invention is not to be limited to the details given herein, but may be modified within the scope and equivalents of the appended claims.

What is claimed is:

1. A strength display device for displaying strength of a building structure, said strength display device comprising:

a storage means for storing data, wherein said data include shape data and relative position data of building structural components of said building structure, stress computational data of said building structural components consistent with attributes of said building structural components, and a plurality of strength level display mode data for displaying strength levels of said building structural components;

a two-dimensional diagram constructing means for constructing a two-dimensional diagram, wherein said two-dimensional diagram constructing means first constructs a virtual three-dimensional model of assembled building structural components based on said shape data and said relative position data retrieved from said storage means and then constructs said two dimensional diagram by projecting selected building structural components, which are selected from said building structural components of said virtual three-dimensional model, onto a plane;

a display means for displaying said two-dimensional diagram constructed by said two-dimensional diagram constructing means on a display screen;

a stress computing means for computing stress values of said building structural components based on said stress computational data retrieved from said storage means;

a selecting means for selecting a predetermined strength level display mode from said plurality of strength level display mode data retrieved from said storage means for said respective building structural components arranged in said two-dimensional diagram based on said stress values of said building structural components computed by said stress computing means; and a strength display means for displaying said predetermined strength level display modes of said building structural components selected by said selecting means on said display screen as said strength level display modes of said building structural components arranged in said two-dimensional diagram wherein the strength level display modes are colors or patterns provided in said two-dimensional diagram such that a single building structural component is displayed as a single color or pattern.

2. A strength display device according to claim 1, wherein said stress computing means computes a plurality of stress values under different load condition settings for each of said building structural components.

3. A strength display device according to claim 2, wherein said selecting means selects said predetermined strength level display mode based on a corresponding predetermined stress value selected from said plurality of stress values computed by said stress computing means.

4. A strength display device according to claim 1, wherein said two-dimensional diagram constructing means projects a cross section of said virtual three-dimensional model onto said plane, wherein said cross section of said virtual three-dimensional model is obtained by cutting said virtual three-dimensional model at a desired position.

5. A strength display device according to claim 1, wherein said stress values are grouped into a plurality of different bands based on magnitudes of said stress values, wherein each of said strength level display modes is assigned to each of said corresponding bands.

6. A storage medium that stores a program for displaying strength of a building structure on a display screen through a computer, wherein said program constructs a virtual three-dimensional model of assembled building structural components of said building structure based on shape data and relative position data of said building structural components and displays a two-dimensional diagram on said display screen, wherein said two-dimensional diagram is obtained by projecting selected building structural components, which are selected from said building structural components of said virtual three-dimensional model, onto a virtual projecting plane located at a predetermined distant position in a predetermined direction, wherein said program further computes stress values of said building structural components based on stress computational data of said building structural components consistent with attributes of said building structural components, and then selects a predetermined strength level display mode from a plurality of strength level display modes for said respective building structural components based on said stress values of said building structural components, wherein said plurality of strength level display modes are provided for each of said building structural components arranged in said two-dimensional diagram, and wherein said program then displays said predetermined strength level display modes on said display screen as said strength level display modes of said building structural components arranged in said two-dimensional diagram wherein the strength level display modes are colors or patterns provided in said two-dimensional diagram such that a single building structural component is displayed as a single color or pattern.

7. A storage medium according to claim 6, wherein said program computes a plurality of stress values under different load condition settings for each of the said building structural components.

8. A storage medium according to claim 7, wherein said program selects said predetermined strength level display mode based on a corresponding predetermined stress value selected from said plurality of stress values computed by said program.

9. A storage medium according to claim 6, wherein said program projects a cross section of said virtual three-dimensional model onto said plane, wherein said cross section of said virtual three-dimensional model is obtained by cutting said virtual three-dimensional model at a desired position.

10. A storage medium according to claim 6, wherein said program groups said stress values into a plurality of different bands based on magnitude of said stress values, wherein each of said strength level display modes is assigned to each of said corresponding bands.

* * * * *